(12) United States Patent
Shul et al.

(10) Patent No.: US 10,217,704 B1
(45) Date of Patent: Feb. 26, 2019

(54) METHOD FOR SIMULTANEOUS MODIFICATION OF MULTIPLE SEMICONDUCTOR DEVICE FEATURES

(71) Applicant: National Technology & Engineering Solutions of Sandia, LLC, Albuquerque, NM (US)

(72) Inventors: Randy J. Shul, Albuquerque, NM (US); Jeffry J. Sniegowski, Tijeras, NM (US); Kurt W. Larson, Cedar Crest, NM (US); William A. Zortman, Corrales, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/794,403

(22) Filed: Oct. 26, 2017

Related U.S. Application Data

(60) Provisional application No. 62/442,521, filed on Jan. 5, 2017.

(51) Int. Cl.
*H01L 21/768* (2006.01)
*H01L 23/522* (2006.01)
(Continued)

(52) U.S. Cl.
CPC .......... *H01L 23/5226* (2013.01); *G06F 17/50* (2013.01); *H01L 21/31144* (2013.01); *H01L 21/475* (2013.01); *H01L 21/486* (2013.01); *H01L 21/76805* (2013.01); *H01L 21/76898* (2013.01); *H01L 23/49827* (2013.01)

(58) Field of Classification Search
CPC .............. H01L 21/31144; H01L 21/32; H01L 21/32053; H01L 21/475; H01L 21/486; H01L 21/76802; H01L 21/76805; H01L 21/76816; H01L 21/76898; H01L 23/49827; H01L 23/5226; H01L 23/5383; H01L 23/5384
See application file for complete search history.

(56) References Cited

U.S. PATENT DOCUMENTS

| 5,140,164 A | 8/1992 | Talbot et al. |
| 6,353,219 B1 | 3/2002 | Kley |

(Continued)

*Primary Examiner* — Stephen W Smoot
(74) *Attorney, Agent, or Firm* — Medley, Behrens & Lewis, LLC

(57) ABSTRACT

Various technologies for simultaneously making a plurality of modifications to a previously manufactured semiconductor are described herein. A mask layer is applied to a surface of the previously manufactured semiconductor device. A pattern is formed in the mask layer, where the pattern is aligned with a plurality of features of the semiconductor device that are desirably modified. Layers of the semiconductor device are etched based on the pattern to create a plurality of vias that each extend through one or more layers of the semiconductor device to a respective feature of the device. A conducting material is deposited into the vias to form a plurality of conducting plugs. Conducting material may be further deposited on the surface of the semiconductor device to connect plugs to one another and/or connect plugs to surface features of the device, thereby forming a plurality of new connections between features of the semiconductor device.

20 Claims, 9 Drawing Sheets

(51) Int. Cl.
*G06F 17/50* (2006.01)
*H01L 21/311* (2006.01)
*H01L 21/48* (2006.01)
*H01L 23/498* (2006.01)
*H01L 21/475* (2006.01)

(56) References Cited

U.S. PATENT DOCUMENTS

| | | |
|---|---|---|
| 6,582,777 B1 | 6/2003 | Ross et al. |
| 6,707,107 B2 | 3/2004 | Kido |
| 6,974,986 B2 * | 12/2005 | Kim .................. H01L 27/10852 |
| | | 257/296 |
| 6,992,290 B2 | 1/2006 | Watanabe et al. |
| 7,628,897 B2 | 12/2009 | Mungekar et al. |
| 2004/0113260 A1 * | 6/2004 | Sunohara ................. H01L 21/78 |
| | | 257/698 |
| 2011/0057321 A1 * | 3/2011 | Wang .................. H01L 21/6835 |
| | | 257/774 |
| 2011/0101539 A1 * | 5/2011 | Kato .................. H01L 21/6835 |
| | | 257/774 |
| 2014/0353839 A1 * | 12/2014 | Lin ....................... H01L 23/481 |
| | | 257/774 |
| 2015/0325497 A1 * | 11/2015 | Yu ..................... H01L 21/31116 |
| | | 257/774 |
| 2016/0240476 A1 * | 8/2016 | Takahashi ........... H01L 23/5283 |

* cited by examiner

US 10,217,704 B1

METHOD FOR SIMULTANEOUS MODIFICATION OF MULTIPLE SEMICONDUCTOR DEVICE FEATURES

RELATED APPLICATIONS

This Application claims priority to U.S. Provisional Patent Application No. 62/442,521, filed on Jan. 5, 2017, and entitled "APPARATUS, SYSTEM AND METHOD FOR PRECISE NAVIGATION AND ADDRESSING OF MULTIPLE SITES OF A DEVICE," the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Modern semiconductor devices often include thousands or millions of components implemented as layers of conducting or semiconducting material deposited on a substrate. Costs to bring such devices to market may run into several million dollars for design and fabrication of photomasks used to construct the devices. As a result, semiconductor manufacturers seek to ensure that a device design is well-functioning prior to committing to costly mask fabrication. In some cases, it may be desirable to implement and test a modification to a previously manufactured semiconductor device to determine if a design correction or modification operates as intended.

Conventionally, modifications to previously manufactured semiconductor devices to implement design corrections have been made using focused ion beams (FIBs) for selective removal or deposition of material in one or more layers of a device. The FIB is repeatedly scanned across a region of the surface of a semiconductor device, to incrementally sputter away or deposit material at the surface. Device modifications using an FIB are made sequentially one at a time by either sputtering material to break one or more existing connections between components of the device or by depositing material to make a connection. Thus, a total time required to implement a series of device modifications may be prohibitively long as the number of desired modifications increases.

Furthermore, reliability of device modifications decreases as a number of total modifications increases. Each time the FIB is aligned in a new position to make an additional device modification in a series of modifications, the likelihood of a misalignment of the FIB in at least one position increases. This increases the chances that at least one of the modifications will cause unintended damage to a portion of the device. The likelihood of the FIB causing unintended damage also increases as the size of individual features decreases. As a result of the time and reliability constraints associated with FIBs, modifications to a device using an FIB are frequently not attempted if a total number of desired modifications exceeds about ten modifications.

SUMMARY

The following is a brief summary of subject matter that is described in greater detail herein. This summary is not intended to be limiting as to the scope of the claims.

Various technologies pertaining to simultaneously performing a plurality of modifications to a previously manufactured semiconductor device are described herein. The technologies described herein are suited to making many modifications (e.g., 100 modifications) to a previously manufactured device simultaneously. A previously manufactured semiconductor device that is desirably modified comprises a plurality of layers that define a plurality of features of the semiconductor device. In an exemplary embodiment, a mask layer is applied to a surface of the previously manufactured semiconductor device. A pattern is formed in the mask layer, where the pattern is aligned with a plurality of features of the semiconductor device that are desirably modified. Layers of the semiconductor are etched based on the pattern to create a plurality of vias that each extend through one or more layers of the semiconductor device to a respective feature of the device. A conducting material is deposited into the vias to form a plurality of conducting plugs. Conducting material is deposited on the surface of the semiconductor device to connect plugs to one another and/or connect plugs to surface features of the device, thereby forming a plurality of new connections between features of the semiconductor device.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
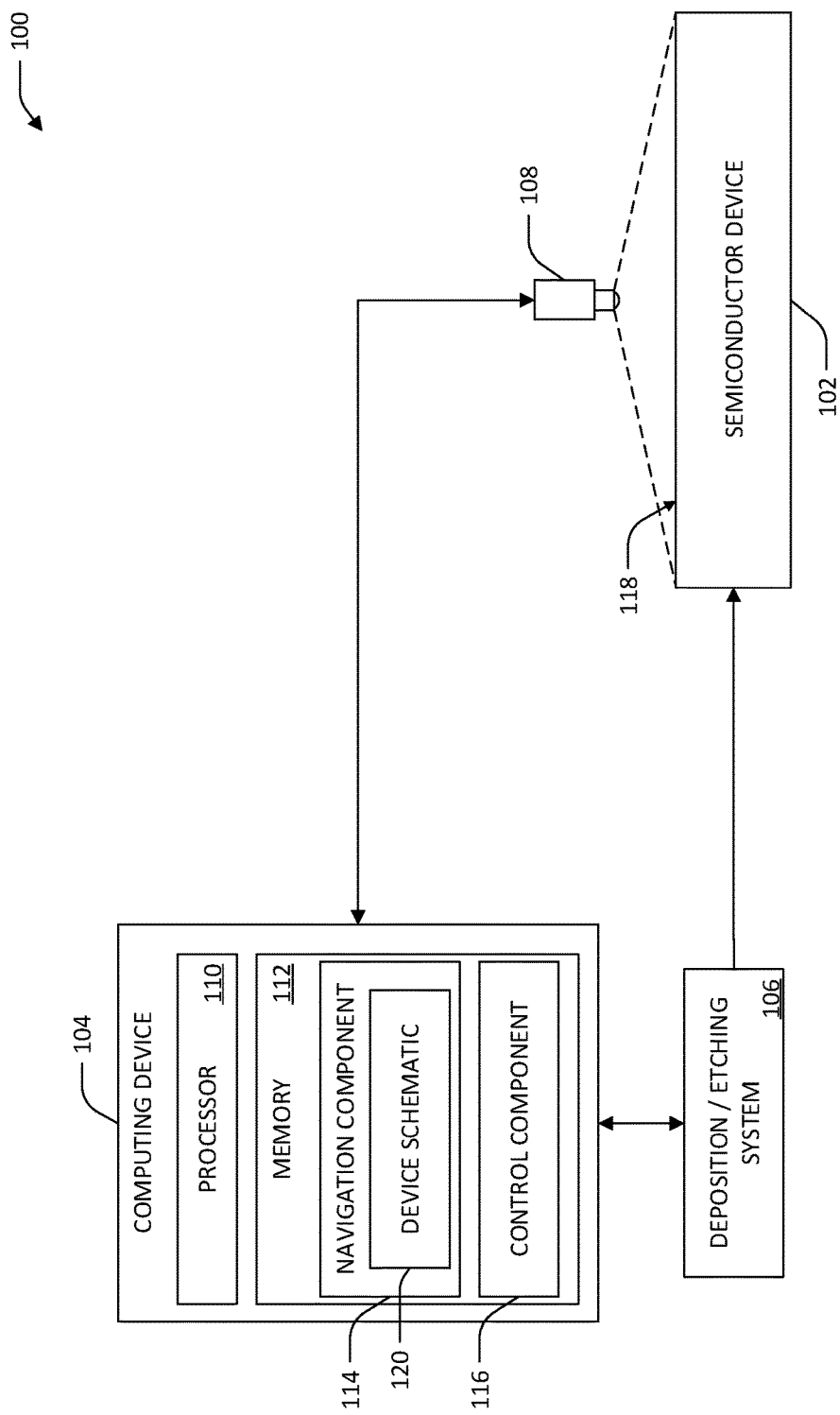
FIG. 1 is a functional block diagram of an exemplary system that facilitates simultaneous modification of a plurality of features of a semiconductor device.

Technologies pertaining to simultaneous modification of a plurality of features of a previously manufactured semiconductor device are now described with reference to the drawings, wherein like reference numerals are used to refer to like elements throughout. The technologies described herein are suitable for simultaneously performing a plurality of modifications (e.g., more than twenty modifications) to a previously manufactured semiconductor. In contrast with conventional techniques for semiconductor device modification that rely on operation of a FIB to sequentially perform modifications to features of a device one at a time, the techniques described herein are usable to implement a plurality of changes to a semiconductor device at a same time.

In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

With reference to FIG. 1, an exemplary system 100 that facilitates simultaneously modifying a plurality of features of a previously manufactured semiconductor device 102 is illustrated. The system 100 includes a computing device 104, a deposition/etching (D/E) system 106, and an imaging device 108. The computing device 104 comprises a processor 110 and memory 112 that is operably coupled to the processor. The memory 112 comprises a navigation component 114 that receives image data from the imaging device 108, where the image data comprises an image of a surface of the semiconductor device 102. The navigation component 114 computes navigation data based on the image data, the navigation data indicative of a position or alignment of one or more features of the semiconductor device. The memory 112 further comprises a control component 116 that controls operation of the D/E system 106 based upon the navigation data.

In operation of the system 100 in connection with simultaneously modifying a plurality of features of the semiconductor device 102, the imaging system 108 generates images of a surface 118 of the semiconductor device 102. The images generated by the imaging system 108 are indicative of a position or alignment of various features of the semiconductor device 102. For instance, in exemplary embodiments the imaging system 108 is an infrared (IR) imaging system that "sees" through silicon layers of the semiconductor device 102 to one or more metal or other layers that define features (e.g., circuit traces, metal contacts, circuit elements, etc.) of the semiconductor device 102. In other embodiments, the surface 118 may include one or more fiducials that can be used to align images with a known schematic layout of various layers and features of the semiconductor device 102. By way of example, the navigation component 114 can include a device schematic 120 (e.g., a GDS file) that indicates parameters of the various layers of the semiconductor device such as thickness, orientation, material, shape, etc. Responsive to receiving an image from the imaging system 108, the navigation component 114 aligns the image with the device schematic 120 based upon the one or more fiducials on the surface 118 of the semiconductor device 102. The aligned image can then be used by the control component 116 in connection with controlling operation of the D/E system 106 for targeted or selective etching and deposition of material on the surface 118 of the semiconductor device 102.

The control component 116 controls the D/E system 106 to perform a series of etching and deposition operations in order to simultaneously modify a plurality of features of the previously manufactured semiconductor device 102. By way of example, the D/E system 106 can be controlled to simultaneously modify between 10 and 100 features, between 25 and 75 features, or between 35 and 60 features of the semiconductor device 102. In an exemplary embodiment, the control component 116 causes the D/E system 106 to deposit a mask layer on the surface 118 of the semiconductor device 102. The D/E system 106 forms a pattern in the mask layer where the pattern is aligned with a plurality of features of the semiconductor device 102 that are desirably modified. The D/E system 106 etches one or more layers of the semiconductor device 102 based upon the pattern of the mask layer in order to create a plurality of vias that each extend through one or more layers of the semiconductor device 102. The D/E system 106 then forms a plurality of connections between the features by way of the vias. In an example, the D/E system 106 forms the plurality of connections by depositing conductive material into the vias to form conductive plugs that extend through the vias to the surface 118 of the semiconductor device 102, and connecting the via plugs by deposition of a layer of straps of conductive material on the surface 118. A plurality of modifications to the semiconductor device 102 are therefore made simultaneously by the system 100 rather than sequentially as required by a conventional FIB modification.

Details of operations performed by the system 100 in an exemplary process for simultaneously performing a plurality of modifications to a previously manufactured semiconductor device are now described with reference to FIGS. 2-7, which illustrate cross-sectional side views of an exemplary semiconductor device 200 at various stages of the process.

Figure 2:
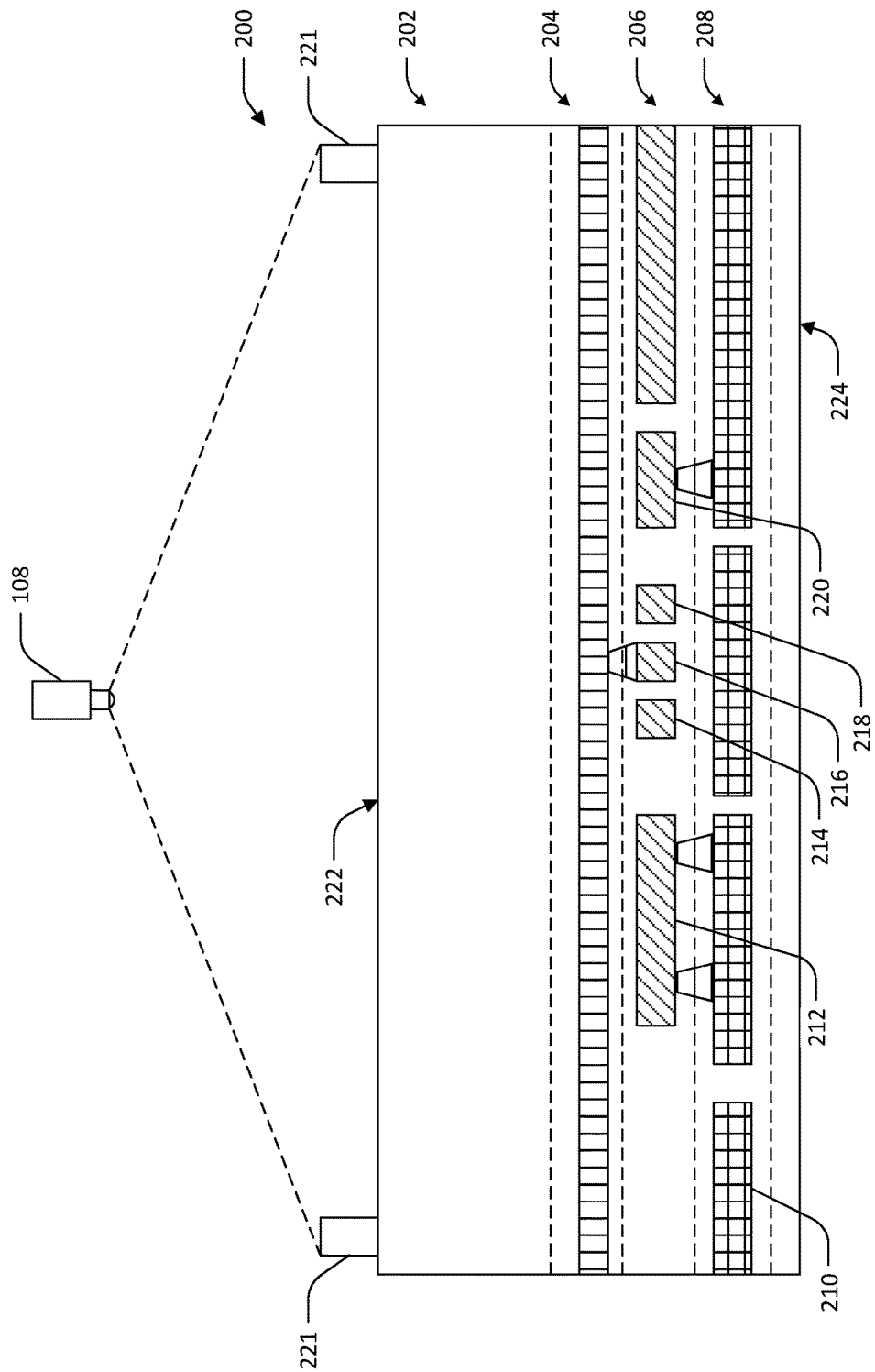
FIG. 2 is a cross-sectional side view of an exemplary previously manufactured semiconductor device.

Referring now to FIG. 2, the semiconductor device 200 is a previously manufactured semiconductor device that is manufactured according to various conventional semiconductor device manufacturing methods known in the art. By way of example, the semiconductor device 200 may be a device manufactured layer-by-layer by conventional photolithographic and chemical processing techniques. The semiconductor device 200 comprises a plurality of layers 202-208 that define features of the semiconductor device 200. The layer 202 comprises a substrate layer on which the layers 204, 206, and 208 are successively deposited in the conventional manufacturing process used to originally manufacture the semiconductor device 200. In an exemplary embodiment, the semiconductor device 200 is a silicon-based device wherein the substrate layer 202 comprises a silicon layer. In other exemplary embodiments, the substrate layer 202 may comprise silicon dioxide, aluminum oxide, germanium, gallium arsenide, etc.

In the semiconductor modification process described herein with respect to FIGS. 2-7, some or all of the features are desirably modified. For instance, in the exemplary modification of the semiconductor device 200 shown in FIGS. 2-7, layer 208 comprises a feature 210 that is desirably modified to be connected to a feature 212 that is formed in layer 206, whereas layer 206 further comprises features 214-218 that are desirably modified to be connected to a second feature 220 that is also formed in layer 206. As described above, various operations described herein may be based upon navigation data pertaining to a semiconductor device. For example, the imaging system 108 may generate images of the semiconductor device 200 that can be used to generate navigation data that is indicative of position or orientation of the semiconductor device 200. In an exemplary embodiment, fiducial markers 221 are deposited on a surface of the semiconductor device 200 in order to provide points of reference by which to determine position or orientation of the semiconductor device 200 in images generated by the imaging system 108.

The exemplary semiconductor device modification depicted in FIGS. 2-7 is a backside device modification, wherein etching and deposition of material to modify the plurality of features 210-220 is performed on a backside 222 of the semiconductor device 200. The backside 222 of the previously manufactured semiconductor device 200 is a surface of the substrate layer 202 that is opposite a surface of the substrate layer 202 on which material is successively deposited in the original manufacturing process of the device 200 to form the layers 204-208. In other embodiments, the process of modification may be a frontside modification, wherein etching and deposition of material to modify the plurality of features 210-220 is performed on a frontside 224 of the semiconductor device 200. As used herein in connection with the backside modification described with respect to FIGS. 2-7, terms such as "above", "top", "higher" etc. are considered with a surface of the semiconductor device 200 on which materials are being deposited as being the "top" of the semiconductor device 200. Thus, for example, the substrate layer 202 is a top layer of the semiconductor device 200, the substrate layer 202 is above the layer 204, which layer 204 is above the layer 206, etc.

Figure 3:
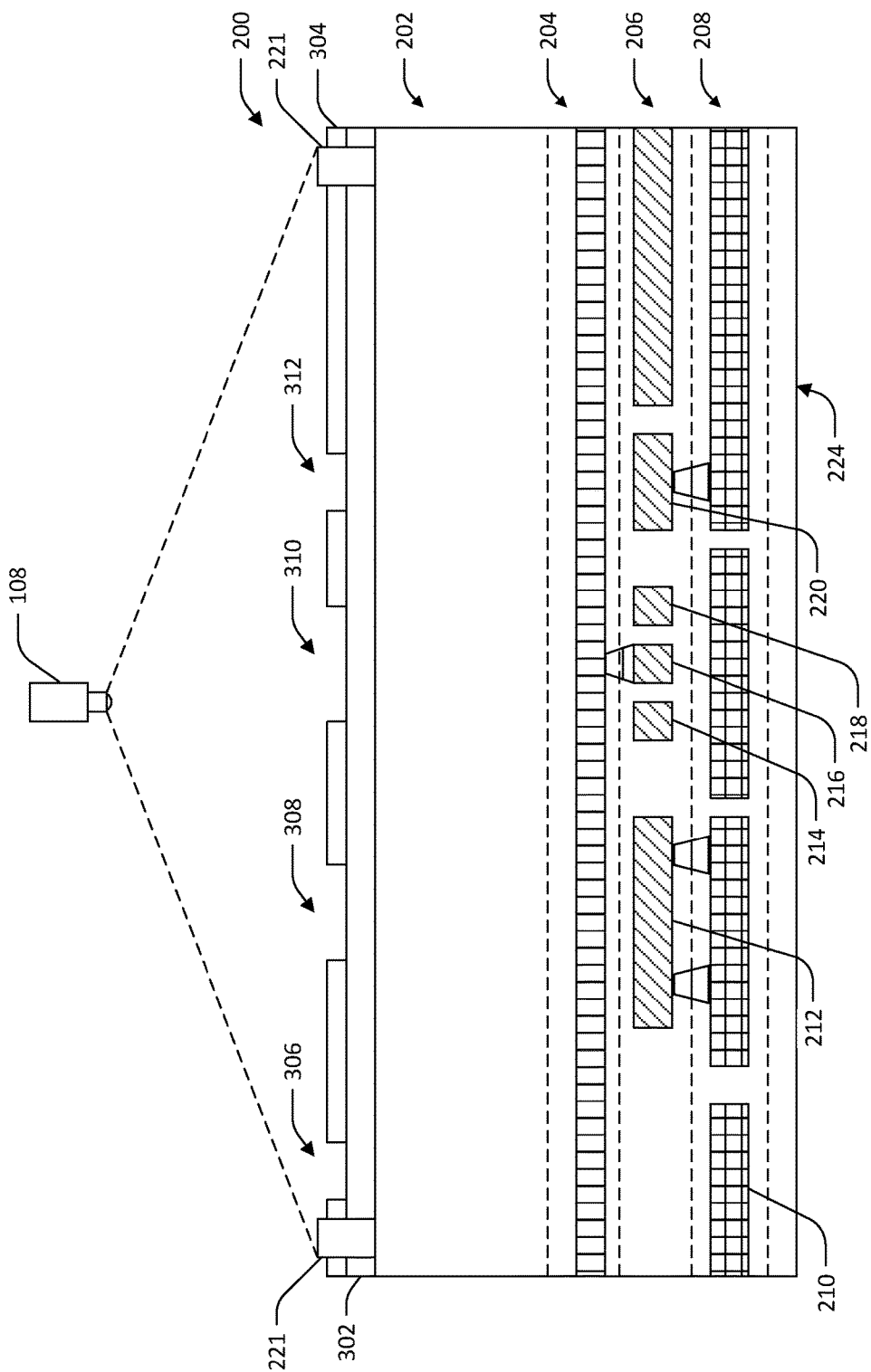
FIG. 3 is a cross-sectional side view of an exemplary semiconductor device during a process for simultaneously modifying a plurality of device features.

Referring now to FIG. 3, the D/E system deposits an etch mask layer 302 on the backside surface 222 of the semiconductor device 200. In the backside device modification process described herein with respect to FIGS. 2-7, the D/E system 106 thins the substrate layer 202 to a thickness of between about 3 μm and about 100 μm prior to deposition of the etch mask layer 302 to facilitate later stages of the modification process. In exemplary embodiments, the D/E system 106 thins the substrate layer 202 by performing laser-assisted chemical etching (LACE), pulsed laser assisted chemical etching (PLACE), spontaneous chemical etching, plasma etching, mechanical removal of substrate material, etc. The D/E system 106 deposits the mask layer 302 according to any of a variety of methods including, but not limited to, atomic layer deposition (ALD), sputter deposition, evaporated alumina deposition, electron-beam direct write masking, etc. A composition of the mask material may depend on a method of etching used to etch vias through the layers 202-208 as described in greater detail below. By way of example, the mask layer 302 can comprise alumina, poly(methyl methacrylate) (PMMA), various metals, glass, resists, etc.

The D/E system 106 forms a pattern in the etch mask layer 302 that is aligned with the features 210-220 of the semiconductor device 200 that are desirably modified. In an exemplary embodiment, the D/E system 106 deposits a resist layer 304 on the etch mask layer 302 that facilitates formation of the pattern in the etch mask layer 302. The pattern is formed in the resist layer 304 such that the pattern is aligned with the plurality of features 210-220 that are desirably modified. For example, a plurality of openings 306-312 are formed in the resist layer. The plurality of openings 306-312 are aligned with the features 210-220 that are desirably modified. By way of example, the opening 306 is formed in the resist layer 304 above the feature 210, the opening 308 is formed above the feature 212, the opening 310 is formed above the features 214-218, and the opening 312 is formed above the feature 220.

Figure 4:
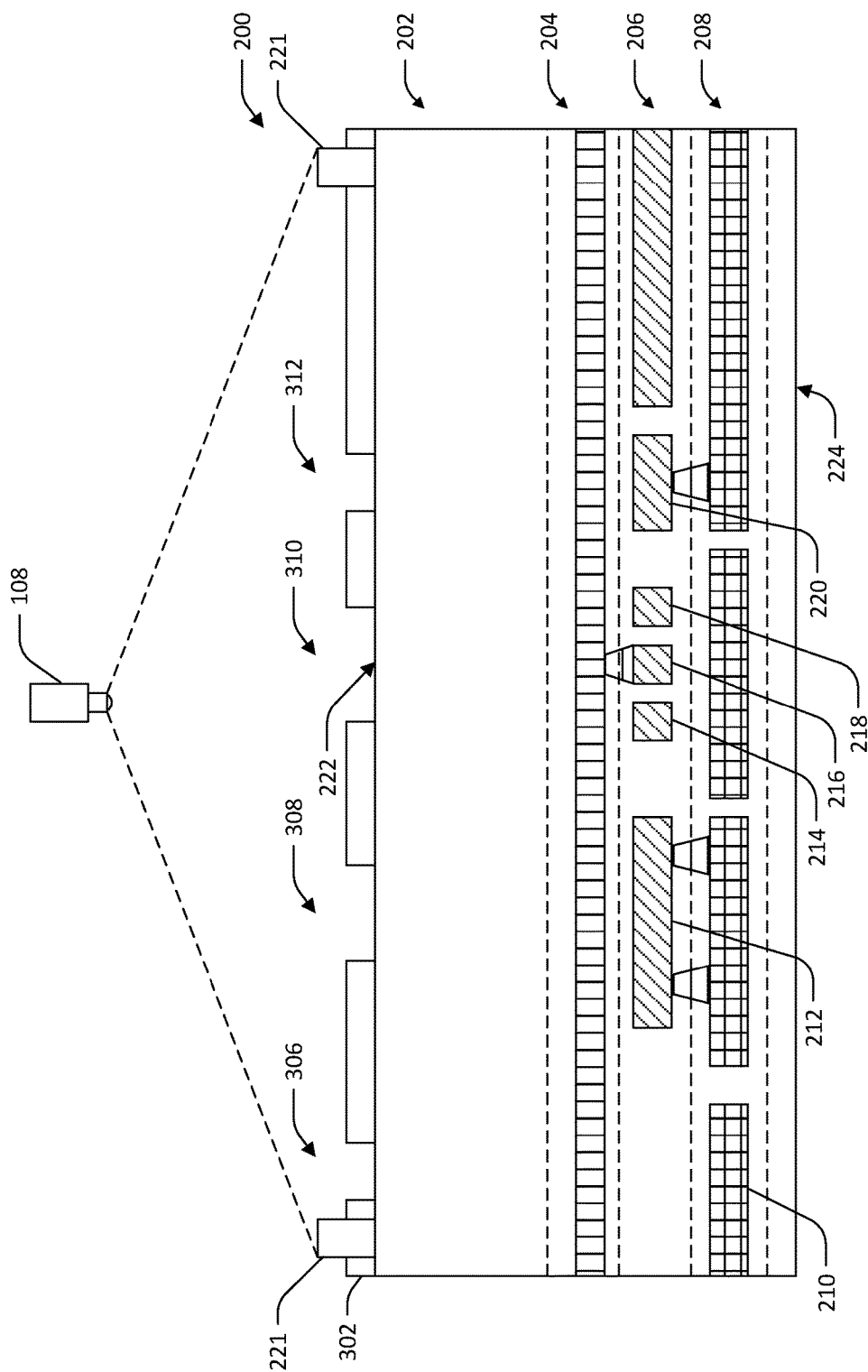
FIG. 4 is another cross-sectional side view of the semiconductor device during an exemplary process for simultaneously modifying a plurality of device features.

The openings 306-312 in the resist layer 304 are extended through the mask layer 302. The openings 306-312 can be extended through the mask layer 302 by any suitable method based upon the material composition of the mask layer 302. For example, the openings 306-312 may be extended through the mask layer 302 using an electron beam, a FIB, laser ablation, plasma etching, etc. The resist layer 304 may then be removed. Referring now to FIG. 4, the semiconductor device 200 is shown with the openings 306-312 extending through the mask layer 302, wherein the resist layer 304 has been removed. Portions of the backside surface 222 are again exposed, by way of the openings 306-312 in the mask layer 302. In other exemplary embodiments, the pattern is formed in the mask layer 302 directly, without depositing the resist layer 304 and forming the pattern in the resist layer 304.

Figure 5:
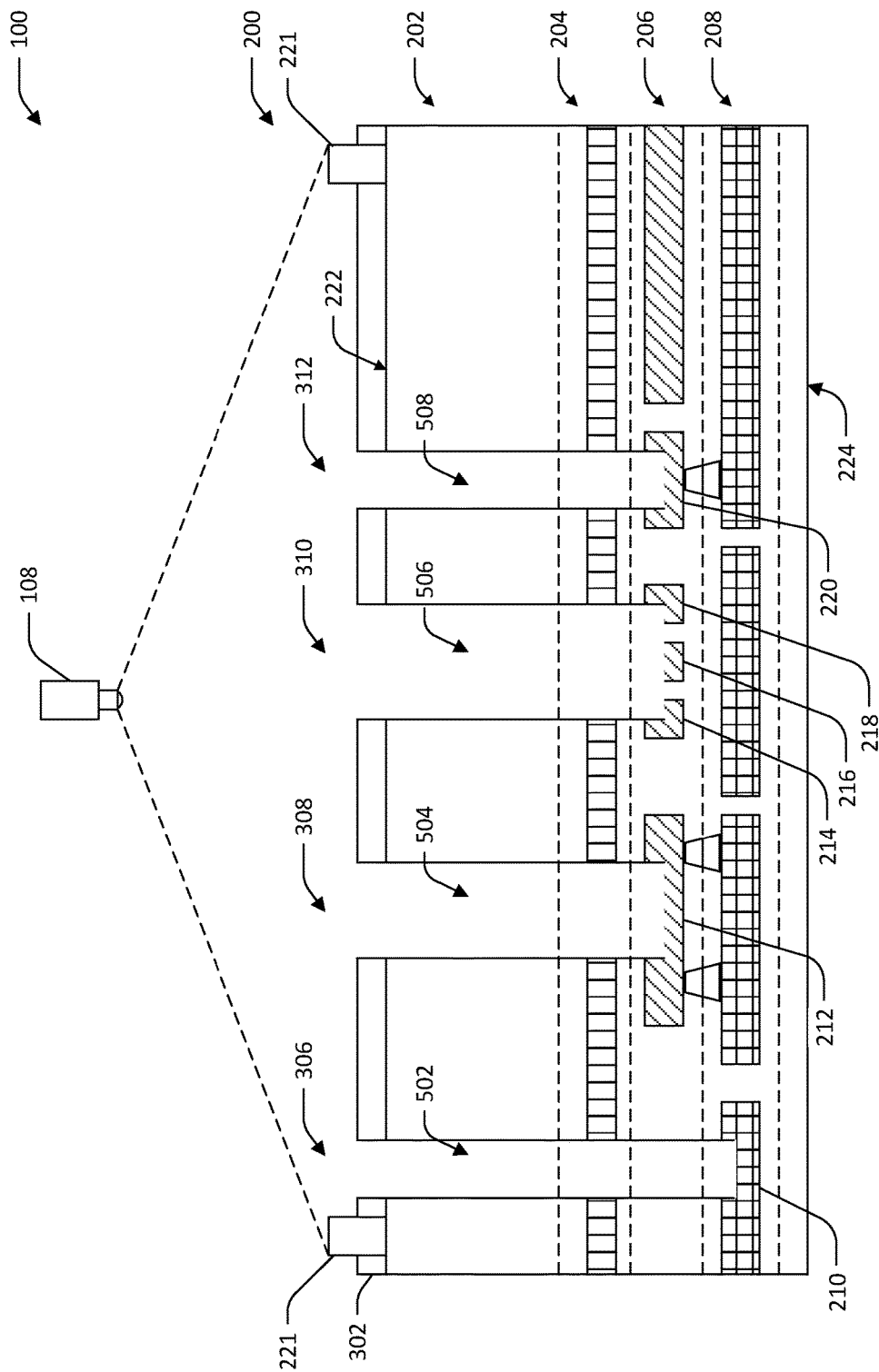
FIG. 5 is yet another cross-sectional side view of the semiconductor device during the process for simultaneously modifying a plurality of device features.
Figure 6:
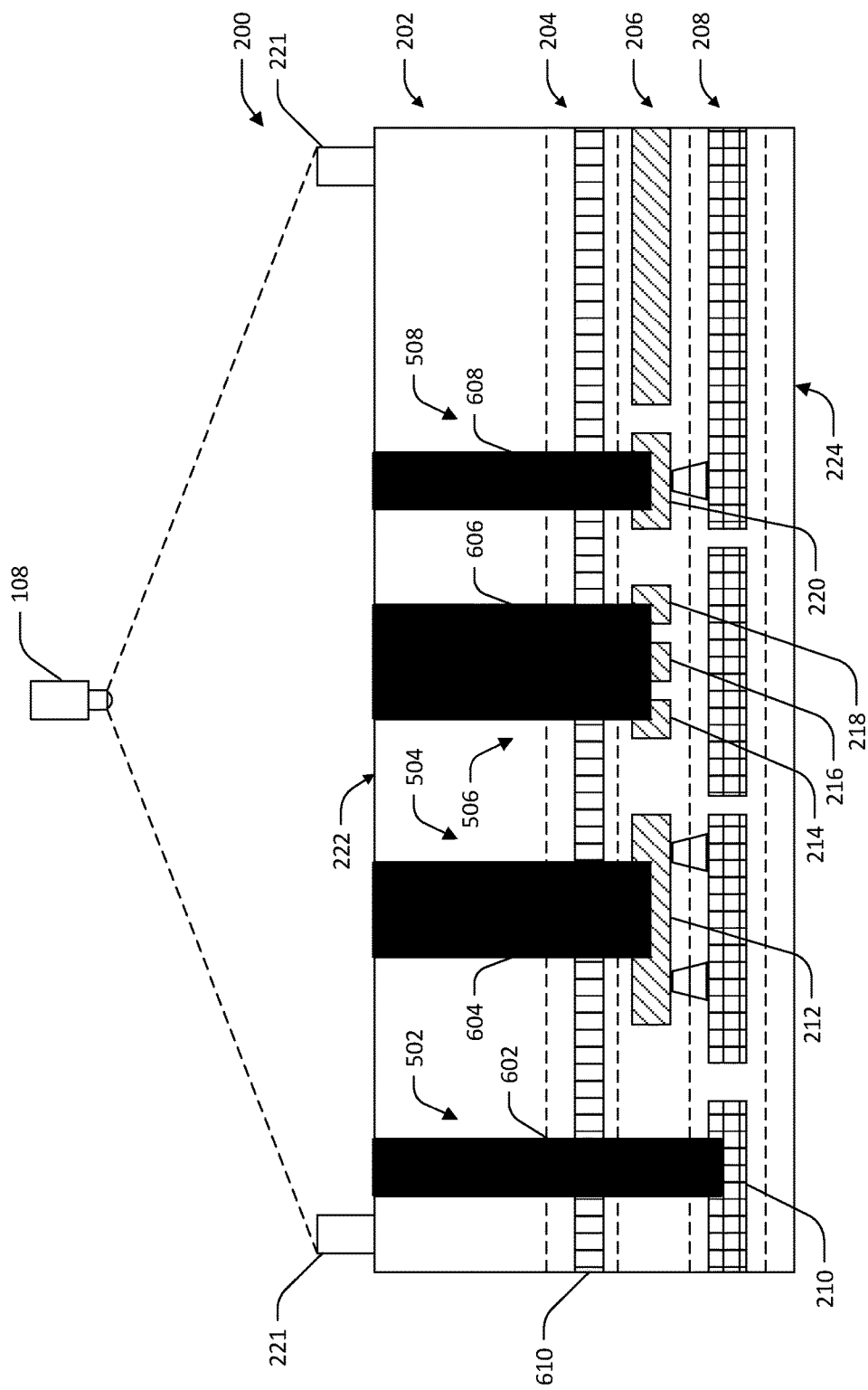
FIG. 6 is still another cross-sectional side view of the semiconductor device during the process for simultaneously modifying a plurality of device features.

Referring now to FIG. 5, a plurality of vias 502-508 are formed in the semiconductor device 200 by etching portions of the layers 202-208 based upon the openings 306-312 in the mask layer 302. The subtractive etch process used to create the vias 502-508 is a surface-based etching process by which etching occurs across the whole of the exposed portion of the backside surface 222 of the semiconductor device 200 simultaneously. The mask layer 302 protects portions of the semiconductor device 200 that are not intended to be modified, while allowing the vias 502-508 to be etched down to the features 210-220 that are desirably modified by way of the openings 306-312. The D/E system 106 can etch the vias 502-508 using a subtractive etch process such as deep reactive-ion etching (DRIE), high density plasma etching (HDP), etc. In an exemplary embodiment, the D/E system 106 controls the etching of the vias 502-508 based upon end-point detection wherein the D/E system 106 stops the etching process when the vias 502-508 reach a feature or layer of a predefined type, such as a metal feature or oxide layer (e.g., as opposed to substrate material making up the substrate layer 202). In another exemplary embodiment, the D/E system 106 performs a timed etch. The duration of the timed etch is selected based upon a structure of the semiconductor device (e.g., as indicated by the device schematic 120) and a known etch time for the various materials making up the semiconductor device 200 for the type of etching being conducted. In an example, sidewalls of the vias 502-508 are substantially vertical such that widths of the bottoms of the vias 502-508 near the features 210-220 are between 85%-100% of the widths of the top openings of the vias 502-508 near the backside surface 222 of the semiconductor device 200. Compared to conventional FIB modifications, an amount of material removed during the etching of the layers 202-208 is more easily controlled, thereby reducing the likelihood of unintended damage to features of the semiconductor device 200.

Once the vias 502-508 are created by the etching process, a plurality of connections may be formed between the features 210-220 by way of the vias 502-508. In an exemplary embodiment, the plurality of connections are formed by depositing a conducting material into the vias 502-508 to form conductive via plugs, and then connecting the via plugs by way of conducting paths or "straps." Referring now to FIG. 6, the semiconductor device 200 is shown wherein the vias 502-508 are filled with plugs 602-608 that comprise a conductive material (e.g., copper). The conductive material making up the plugs 602-608 may be deposited by the D/E system 106 by surface deposition techniques such as ALD, evaporative deposition, chemical vapor deposition, sputter deposition, etc. In other embodiments, the material that forms the plugs 602-608 may be deposited by selective deposition techniques.

In various embodiments, prior to forming the conductive plugs 602-608, the D/E system 106 deposits a layer of insulating material in each of the vias 502-508. The insulating layer provides electrical isolation between material in the vias 502-508 (e.g., the plugs 602-608) and material in the layers 202-208 through which the vias 502-508 extend. The D/E system 106 deposits the insulating layer such that an interior surface of each of the vias 502-508 is coated with the insulating material. In exemplary embodiments, the D/E system 106 deposits the insulating material by way of a surface deposition technique or a selective deposition technique. Once the insulating layer is formed and prior to depositing the conductive material that makes up the plugs 602-608, the D/E system 106 removes the insulating material from the bottom of each of the vias 502-508 where the vias 502-508 intersect with their respective corresponding features 210-220, while leaving intact insulating material on the sidewalls of the vias 502-508. Thus, the vias 502-508 are electrically isolated from the layers 202-208 of the semiconductor device 200 through which the vias 502-508 extend (and features that may be present in those layers, e.g., a feature 610 that extends through the width of the layer 204), but allow the plugs 602-608 to make electrical contact with the desirably modified features 210-220 at the bottom of the vias 502-508. In various embodiments, the D/E system 106 removes the insulating material from the bottom of the vias 502-508 by chemical removal, laser ablation, plasma etching, etc.

Figure 7:
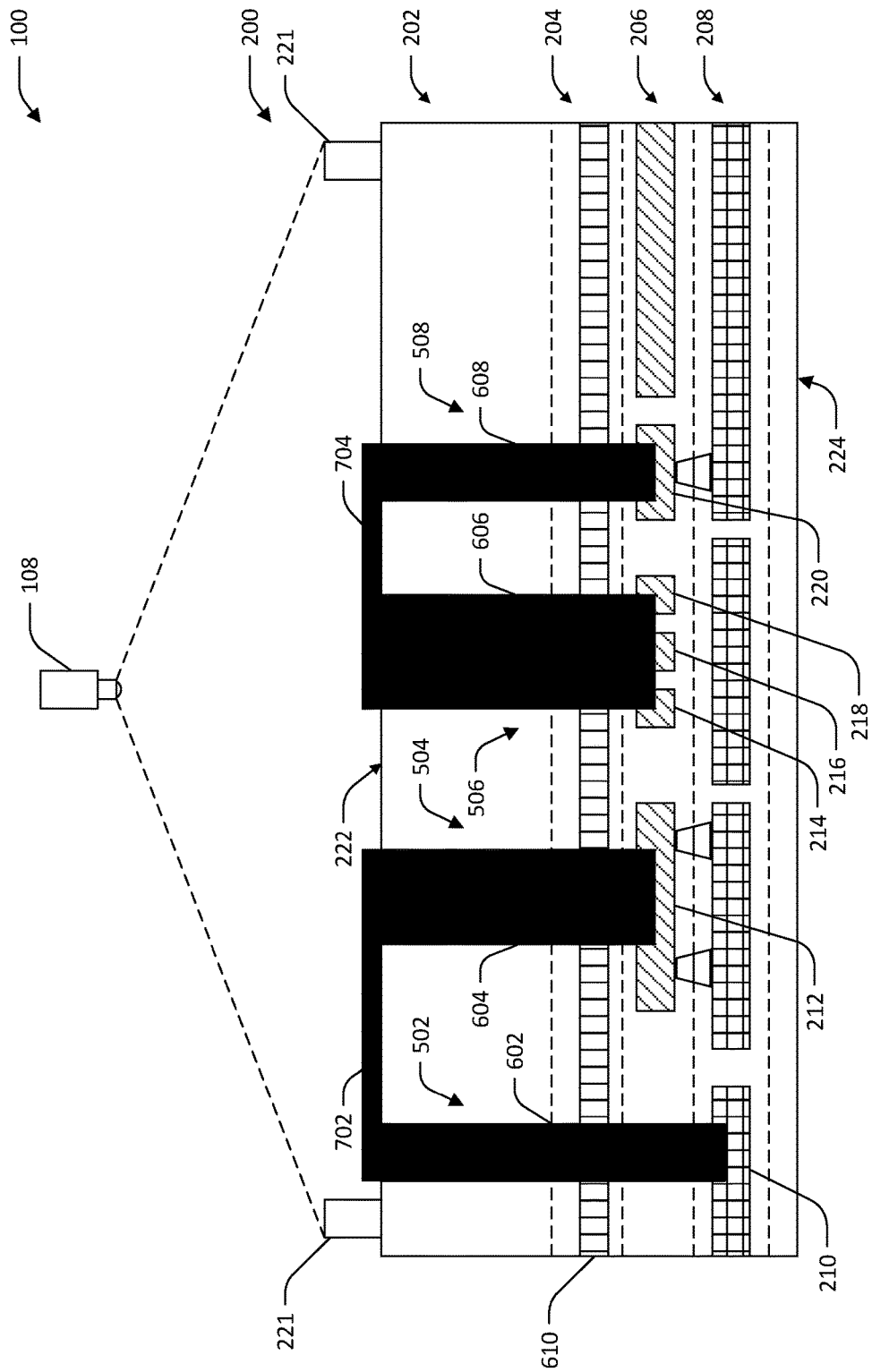
FIG. 7 is still yet another cross-sectional side view of the semiconductor device during the process for simultaneously modifying a plurality of device features.

Referring now to FIG. 7, the D/E system 106 deposits a conductive layer (e.g., a metal layer) on the backside surface 222 of the semiconductor device 200, where the conductive layer is configured to connect each of the vias 502-508 to at least one other via in order to complete connections between the desirably modified features 210-220. The conductive layer may be deposited as straps that each connect one or more of the vias 502-508 together. For example, as shown in FIG. 7 the conductive layer is deposited as two conductive straps 702 and 704. The strap 702 connects the plug 602 to the plug 604, thereby modifying the semiconductor device 200 to connect the feature 210 to the feature 212. The strap 704 connects the plug 606 to the plug 608, thereby connecting the features 214-218 (themselves modified to be connected to one another by the plug 606) to the feature 220. In various embodiments, prior to depositing the conductive layer that connects the via plugs 602-608, the D/E system 106 deposits an insulating layer on the surface 222 of the semiconductor device 200. The insulating layer provides electrical isolation between, for example, the straps 702, 704 and the substrate 202, which may be partially conductive, or surface features of the semiconductor device 200 that are exposed on the backside surface 222. In an exemplary embodiment, the insulating layer is applied to the surface 222 of the semiconductor device 200 simultaneously with the insulating material being deposited into the vias 502-508. In this embodiment, the mask layer 302 is removed from the semiconductor device 200 prior to depositing the insulating material.

In contrast with conventional FIB approaches to semiconductor device modification, the etching and deposition processes described herein with respect to FIGS. 2-7 modify the device features 210-220 simultaneously. In the semiconductor device modification process described herein, the vias 502-508 are formed simultaneously. Similarly, the plugs 602-608 are formed simultaneously. In a conventional FIB device modification process, the FIB would have to etch the device 200 to reach each of the features 210-220 one at a time in series, and would then have to deposit material to connect each of the features 210-220 one at a time in series.

Figure 8:
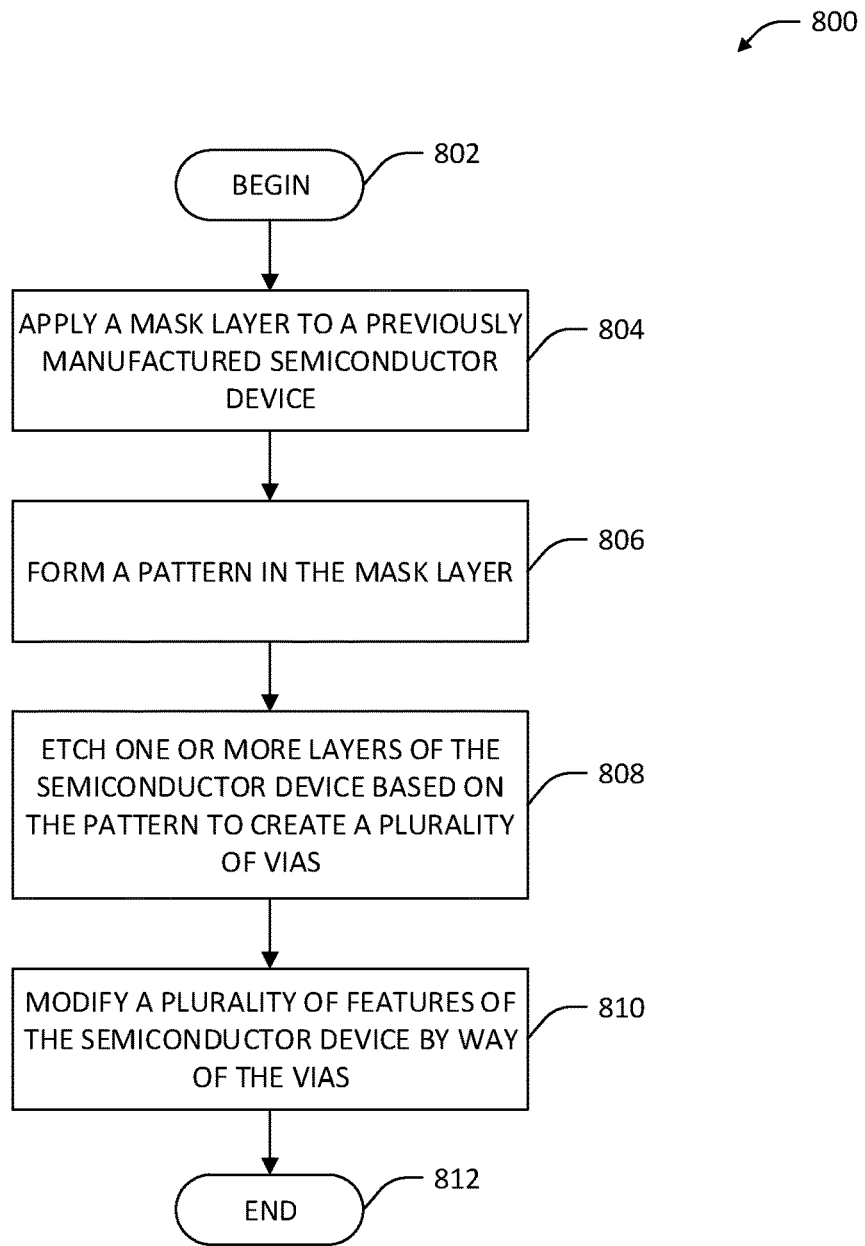
FIG. 8 is a flow diagram that illustrates an exemplary methodology for simultaneously modifying a plurality of features of a previously manufactured semiconductor device.

FIG. 8 illustrates an exemplary methodology for simultaneously modifying a plurality of features of a previously manufactured semiconductor device. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, various acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Referring now to FIG. 8, a methodology 800 that facilitates simultaneously modifying a plurality of features of a previously manufactured semiconductor device is illustrated. The methodology 800 begins at 802, and at 804 a mask layer is applied to the previously manufactured semiconductor device. In exemplary embodiments, the mask layer is deposited on a frontside of the semiconductor device if a frontside device modification is desirably performed, or the mask layer is deposited on a backside of the semiconductor device if a backside device modification is desirably performed.

At 806, a pattern is formed in the mask layer that is aligned with the plurality of features of the semiconductor device that are to be modified. In exemplary embodiments, the pattern may be formed in the mask layer by etching the mask layer based upon a photomask resist layer deposited on top of the mask layer. In other exemplary embodiments the pattern may be formed in the mask layer by selectively etching the mask layer with an electron beam or FIB. The pattern is aligned with the desirably modified features of the semiconductor device such that when the masked surface of the semiconductor device is etched based upon the pattern in the mask, a plurality of vias are created that extend through layers of the semiconductor device to the desirably modified features. At 808, one or more layers of the semiconductor device are etched based on the pattern formed in the mask layer at 806. The etching creates a plurality of vias, each of which extends from a surface of the semiconductor device through one or more layers of the device to a respective feature or features in the desirably modified features.

A plurality of features of the semiconductor device are modified by way of the vias at 810. By way of example, a conducting material is deposited in each of the vias such that a continuous portion of conductive material extends from a desirably modified feature to the surface of the semiconductor device. An insulator may be deposited onto the surface of the semiconductor device and into the vias to cover sidewalls of the vias prior to depositing the conducting material in order to electrically isolate the conducting material in the vias from the semiconductor substrate that comprises the bulk of the semiconductor device. In exemplary embodiments, features are further modified by joining conductive material in a first via to the conductive material in a second via by way of a layer of conducting material deposited on the surface of the semiconductor device. Together, this forms a connection between the features with which the first and second vias are aligned. A plurality of such connections between features is formed by joining the conductive material of features' corresponding vias with surface conducting elements. The methodology 800 ends 812.

Figure 9:
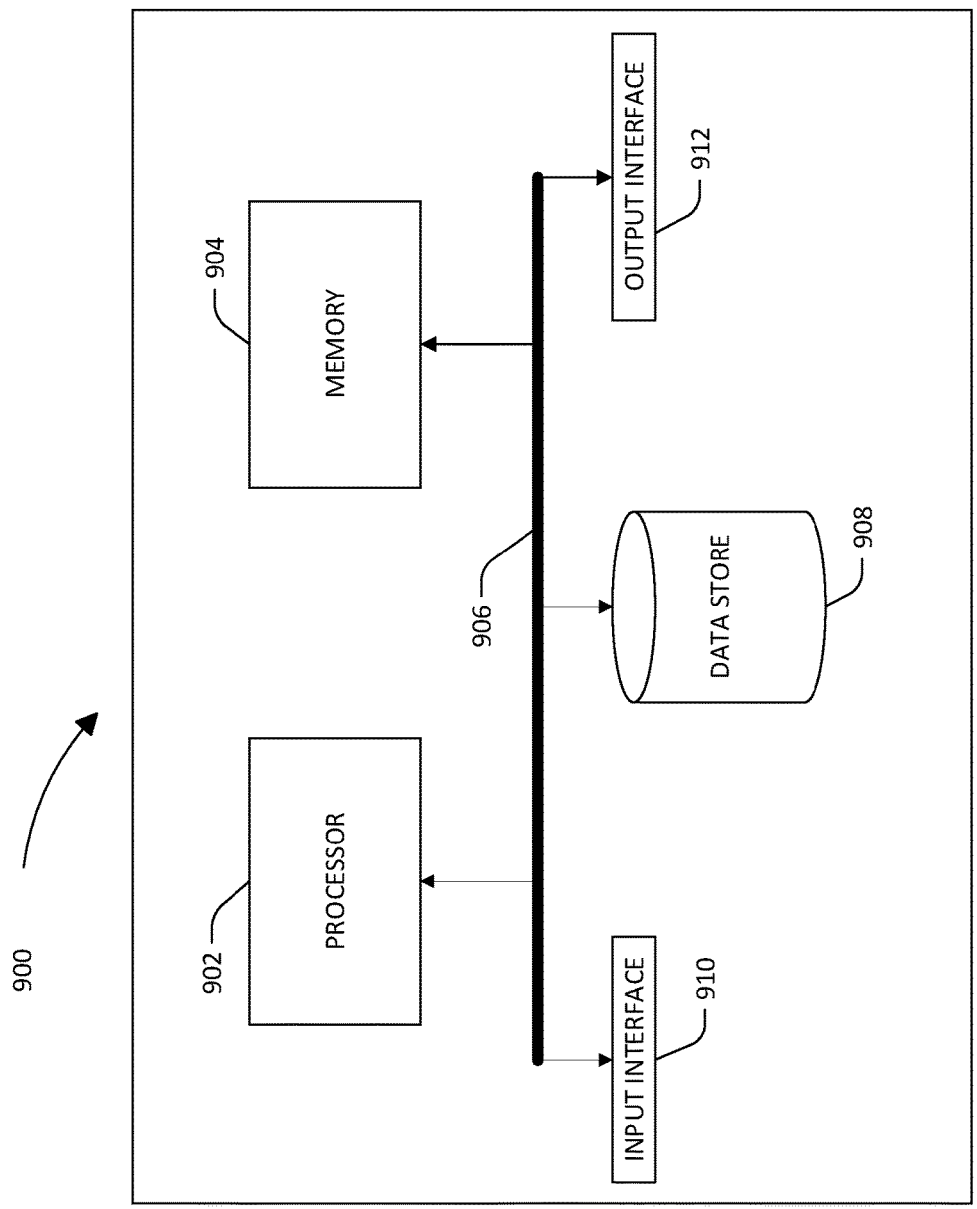
FIG. 9 is an exemplary computing system.

Referring now to FIG. 9, a high-level illustration of an exemplary computing device 900 that can be used in accordance with the systems and methodologies disclosed herein is illustrated. For instance, the computing device 900 may be used in a system that facilitates control and navigation of a deposition and etching system that performs modifications to previously manufactured semiconductor devices. The computing device 900 includes at least one processor 902 that executes instructions that are stored in a memory 904. The instructions may be, for instance, instructions for implementing functionality described as being carried out by one or more components discussed above or instructions for implementing one or more of the methods described above. The processor 902 may access the memory 904 by way of a system bus 906. In addition to storing executable instructions, the memory 904 may also store image data from an imaging system, or device schematics for use in connection with navigation of a deposition and etching system.

The computing device 900 additionally includes a data store 908 that is accessible by the processor 902 by way of the system bus 906. The data store 908 may include executable instructions, device schematics, navigation data, image data, etc. The computing device 900 also includes an input interface 910 that allows external devices to communicate with the computing device 900. For instance, the input interface 910 may be used to receive instructions from an external computer device, from a user, etc. The computing device 900 also includes an output interface 912 that interfaces the computing device 900 with one or more external devices. For example, the computing device 900 may display text, images, etc. by way of the output interface 912.

It is contemplated that the external devices that communicate with the computing device 900 via the input interface 910 and the output interface 912 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 900 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 900 may be a distributed system. Thus, for instance, several devices may be in communication by way of a network connection and may collectively perform tasks described as being performed by the computing device 900.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A method, comprising:
    simultaneously modifying a plurality of features of a previously manufactured semiconductor device, wherein the semiconductor device comprises a plurality of layers deposited on a substrate, the plurality of layers defining the plurality of features of the semiconductor device, the modifying the plurality of features comprising:
        applying a mask layer to the previously manufactured semiconductor device;
        forming a pattern in the mask layer, the pattern aligned with the plurality of features of the semiconductor device;
        etching one or more of the layers based upon the pattern to create a plurality of vias, each of the vias extending through one or more of the layers to a respective feature in the features; and
        forming a plurality of connections between the features and a surface of the semiconductor device by way of the vias.

2. The method of claim 1, wherein forming the plurality of connections comprises depositing a conducting material into the vias such that the conducting material substantially fills the vias.

3. The method of claim 2, further comprising depositing a metal layer to a surface of the previously manufactured semiconductor device, the metal layer configured to connect at least one of the features to at least one other of the features.

4. The method of claim 2, wherein forming the plurality of connections further comprises depositing an insulating material into the vias prior to depositing the conducting material into the vias.

5. The method of claim 1, wherein the plurality of features comprises between 10 and 100 features.

6. The method of claim 1, wherein the plurality of features comprises between 25 and 75 features.

7. The method of claim 1, wherein the plurality of features comprises between 35 and 60 features.

8. The method of claim 1, wherein forming the pattern in the mask layer comprises:
    applying a resist layer to the mask layer;
    forming the pattern in the resist layer; and
    etching the pattern into the mask layer based on the pattern in the resist layer.

9. The method of claim 1, wherein the etching the one or more of the layers is performed by deep reactive-ion etching (DRIE).

10. The method of claim 1, wherein applying the mask layer to the previously manufactured semiconductor device comprises applying the mask layer to a backside surface of the previously manufactured semiconductor device.

11. A method for modifying a plurality of features of a previously manufactured semiconductor device that comprises a plurality of layers deposited on a substrate, the plurality of layers defining the plurality of features of the semiconductor device, comprising:
    applying a mask layer to a surface of the previously manufactured semiconductor device, the mask layer having a pattern formed therein, the pattern aligned with a plurality of features in the features that are desirably modified;
    etching the semiconductor device based upon the pattern in the mask layer to form a plurality of holes in the semiconductor device, each of the holes extending through one or more of the layers of the semiconductor device to a respective feature in the features that are desirably modified; and
    connecting the features that are desirably modified to the surface of the semiconductor device by way of the holes.

12. The method of claim 11, further comprising connecting at least one of the features that is desirably modified to at least one other of the features that is desirably modified by way of the holes.

13. The method of claim 11, wherein connecting the features that are desirably modified to the surface of the semiconductor device by way of the holes comprises filling the holes with an electrically conductive material.

14. The method of claim 13, further comprising coating an interior surface of the holes with an insulating material prior to filling the holes with the electrically conductive material.

15. The method of claim 11, wherein the mask layer comprises at least one of alumina, poly(methyl methacrylate) (PMMA), or a resist film.

16. The method of claim 11, wherein the pattern comprises a plurality of openings in the mask layer, each of the openings corresponding to a respective feature or set of features in the semiconductor device.

17. A method for modifying features of a previously manufactured semiconductor device, comprising:
    applying a mask layer to a backside of the semiconductor device;
    forming a pattern in the mask layer, the pattern comprising a plurality of holes, the holes in the mask layer aligned with features of the semiconductor device that are desirably modified;
    etching a plurality of holes in the semiconductor device, the holes in the semiconductor device aligned with the holes in the mask layer, each of the holes in the semiconductor device extending through one or more layers of the semiconductor device to a respective feature of the semiconductor device;
    depositing a conductive material in the holes, wherein the conductive material substantially fills the holes; and
    forming connections between the desirably modified features of the semiconductor device by making connections between conductive material in a first set of holes and conductive material in a second set of holes.

18. The method of claim 17, wherein forming the pattern in the mask layer comprises:
    applying a resist layer to the mask layer;
    forming the pattern in the resist layer; and
    etching the pattern in the mask layer based on the resist layer.

19. The method of claim 17, further comprising coating an interior surface of each of the holes with an insulating material prior to depositing the conductive material in the holes.

20. The method of claim 17, wherein the forming connections between the desirably modified features of the semiconductor device comprises forming connections between 10 to 100 features of the semiconductor device.

* * * * *